United States Patent
Kawamura et al.

(10) Patent No.: US 10,622,057 B2
(45) Date of Patent: Apr. 14, 2020

(54) TRI-LEVEL DRAM SENSE AMPLIFER

(71) Applicant: Micron Technology, Inc., Boise, ID (US)

(72) Inventors: Christopher J. Kawamura, Boise, ID (US); Charles L. Ingalls, Meridian, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/963,663

(22) Filed: Apr. 26, 2018

(65) Prior Publication Data

US 2018/0315467 A1   Nov. 1, 2018

Related U.S. Application Data

(60) Provisional application No. 62/490,904, filed on Apr. 27, 2017.

(51) Int. Cl.
*G11C 7/06* (2006.01)
*G11C 11/4091* (2006.01)
*G11C 11/56* (2006.01)

(52) U.S. Cl.
CPC .......... *G11C 11/4091* (2013.01); *G11C 7/065* (2013.01); *G11C 11/565* (2013.01); *G11C 2211/563* (2013.01)

(58) Field of Classification Search
None
See application file for complete search history.

(56) References Cited

U.S. PATENT DOCUMENTS

| | | | | |
|---|---|---|---|---|
| 5,566,116 A * | 10/1996 | Kang | ................. | G11C 11/4091 365/149 |
| 5,675,266 A * | 10/1997 | Kawate | ................ | H03K 5/2481 327/112 |
| 5,936,898 A * | 8/1999 | Chi | .......................... | G11C 7/12 365/190 |
| 8,437,213 B2 * | 5/2013 | Deng | ..................... | G11C 29/50 365/226 |
| 9,478,277 B1 * | 10/2016 | Liu | ..................... | G11C 11/4096 |

* cited by examiner

*Primary Examiner* — Douglas King
(74) *Attorney, Agent, or Firm* — Schwegman Lundberg & Woessner, P.A.

(57) ABSTRACT

A sensing system can read from a memory cell configured to store a data bit and to produce a differential signal indicating a data state of the memory cell. The data state can be selected from three data states. An example of the system can include a pair of bit lines, a pair of sense amplifiers (SAs), and a data output circuit. The bit lines are coupled to the memory cell to receive the differential signal. The SAs are each independently coupled to the bit lines through an isolation circuit. The data output circuit can receive outputs from the SAs and indicate the data state of the memory cell based on the outputs.

20 Claims, 6 Drawing Sheets

TRI-LEVEL DRAM SENSE AMPLIFER

PRIORITY APPLICATION

This application claims the benefit of priority to U.S. Provisional Application Ser. No. 62/490,904, filed Apr. 27, 2017, which is incorporated herein by reference in its entirety.

BACKGROUND

A memory device, such as a dynamic random access memory (DRAM) device, can include memory cells each configured to store a binary data bit (1 or 0) and produce a signal on a bit line that represents the data bit. To read the data bit from a memory cell, a sense amplifier can be used to amplify the signal on the bit line to a level allowing for reliable detection of the data bit as "1" (logic high) or "0" (logic low). Some memory devices can store data bits having more than two logic levels. For example, a 3-level DRAM may store data bits having logic levels corresponding to Vcc (DRAM supply voltage), Vcc/2, and 0. This allows each data bit to have a third state in addition to the logic high and low states.

BRIEF DESCRIPTION OF THE DRAWINGS

The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document discusses, among other things, a system and method for tri-level sensing in a dynamic random access memory (DRAM) that includes complementary digit lines with differential signals representing stored data bits. The DRAM can include an array of memory cells each configured for storing a data bit using a 2-transistor, 1-capacitor ("2T-1C") or 2-transistor, 2-capacitor ("2T-2C") architecture. The capacitor(s) of each memory cell charge a complementary pair of digit lines to produce a differential signal indicating a data state of the memory cell. Possible data states can include a high state (binary data "1"), a low state (binary data "0"), and a neutral state (lack of data). The neutral state can be stored in the memory cells by, for example, writing Vcc/2 into them. The present system provides for reading of such a neutral state, in additional to the binary 1's and 0's, from the memory cells. In various embodiments, a third data state can allow for operations not feasible with two logic states. For example, availability of the third data state can enable new types of processor-in-memory (PIM) functions. In another example, two tri-level memory bits can effectively be combined in order to represent 3 binary bits of data, thus creating a multi-level DRAM. In another example, the third data state can also be useful for error-correcting code (ECC) operations.

The present system uses two sense amplifiers to sense three data states from each memory cell. Both sense amplifiers are connected to the same digital lines carrying the differential signal from a memory cell, and are enabled for sensing at the same time. Isolation ("ISO") devices are used to independently feed the differential signal into each sense amplifier without affecting the operation of the other sense amplifier. One sense amplifier is preconditioned to read its gut node digit as "1" (high state), while the other sense amplifier is preconditioned to read its gut digit as "0" (low state). If the memory cell had a "1" or a "0" stored in it, then the differential signal is strong enough to overcome the built in bias of the sense amplifiers such that both sense amplifiers correctly read these data states. However, if the neutral data state is stored in the memory cell, the data state is sensed by one sense amplifier senses as a "1" while being sensed by the other sense amplifier as a "0". The sensing results from both sense amplifiers are then subjected to an exclusive OR (XOR) operation. If the XOR operation results in a "0" (i.e., the output of both sense amplifiers are equal), then the sensed results of either sense amplifier can be directly used as the sensed data state. If the XOR operation results in a "1" (i.e., the outputs of both sense amplifiers are complementary), then the neutral state is sensed. In various embodiments, the array of memory cells is built using a technology that allows the sense amplifiers and other required circuitry to be placed under the memory cells in order not to affect die size substantially.

In various embodiments, the pair of sense amplifiers for sensing each memory cell is biased to make them sense certain data states when presented with the neutral state signal level. This is accomplished by utilizing the built in gate-to-source/drain overlap capacitance of the ISO devices to separate the sense amplifier gut nodes by a predetermined amount of voltage. When no signal is present (the neutral state), this causes the sense amplifiers to flip in the desired direction to result in either "1" or "0". When the memory cell state is a "1" or "0", the large signal produced on the gut node of each sense amplifiers overcomes the built-in bias of that sense amplifier, and both sense amplifiers read the data state correctly.

Figure 1:
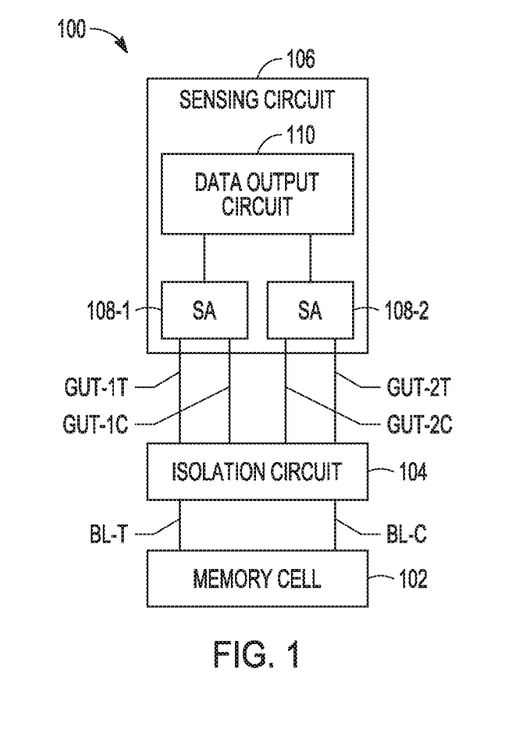
FIG. 1 illustrates an embodiment of a system for tri-level sensing of a dynamic random access memory (DRAM) cell.

FIG. 1 illustrates an embodiment of a system 100 for tri-level sensing of a DRAM cell. System 100 can be implemented as a portion of a circuit of a DRAM device. In the illustrated embodiment, system 100 can include a memory cell 102, a pair of complementary bit lines BL-T (bit line-true) and BL-C (bit line-complement), an isolation circuit 104, and a sensing circuit 106.

Memory cell 102 can store a data bit and produce a differential signal across the pair of complementary bit lines BL-T and BL-C. The differential signal indicates a data state of memory cell 102. The data state can be selected from three predetermined data states including, for example: a high state (data "1"), a low state (data "0"), and a neutral state (lack of data). Examples of a circuit for memory cell 102 are discussed below with reference to FIGS. 3 and 4.

Sensing circuit 106 is coupled to memory cell 102 through isolation circuit 104 to read the data bit stored in memory cell 102. Sensing circuit 106 includes a pair of sense amplifiers (SAs) each independently coupled to the pair of BL-T and BL-C through isolation circuit 104. The pair of SAs includes a first SA 108-1 and a second SA 108-2. SA 108-1 has a first input (gut node-true) GUT-1T coupled to BL-T through isolation circuit 104, a second input (gut node-complement) GUT-1C coupled to BL-C through isolation circuit 104, and an output configured to indicate data state being what SA 108-1 reads. SA 108-2 has a first input (gut node-true) GUT-2T coupled to BL-T through isolation circuit 104, a second input (gut node-complement) GUT-2C coupled to BL-C through isolation circuit 104, and an output configured to indicate data state being what SA 108-2 reads. In various embodiments, SA 1084 and SA 108-2 are substantially identical (which means, for example, the two SAs are identical by design, but with manufacturing tolerances).

Isolation circuit 104 feeds the differential signals to SA 108-1 and SA 108-2 independently (without affecting operation of the other). In various embodiments, isolation circuit 104 can precondition one of SA 108-1 and SA 108-2 to read "1" and the other of SA 1084 and SA 108-2 to read "0". An example of isolation circuit 104 is discussed below with reference to FIG. 2.

Sensing circuit 106 can include a data output circuit 110 to receive outputs from SA 108-1 and SA 108-2 and indicate the data state of memory cell 102 based on the received outputs. In various embodiments, data output circuit 110 indicates a data state equal to the data state read by both SA 108-1 and SA 108-2 when the data states read by SA 1084 and SA 108-2 are equal, and includes the neutral data state when the data states read by SA 108-1 and SA 108-2 are different. In one embodiment, the outputs from SA 108-1 and SA 108-2 are exclusive-OR (XOR) gated in data output circuit 110 to determine whether the data state of memory cell 102 is the data state read by both SA 108-1 and SA 108-2 or the neutral state. If SA 108-1 reads "0" and SA 108-2 reads "0", the XOR result is "0", and the data state of memory cell 102 is "0". If SA 108-1 reads "0" and SA 108-2 reads "1", the XOR result is "1", and the data state of memory cell 102 is neutral. If SA 108-1 reads "1" and SA 108-2 reads "0", the XOR result is "1", and the data state of memory cell 102 is neutral. If SA 108-1 reads "1" and SA 108-2 reads "1", the XOR result is "0", and the data state of memory cell 102 is "1".

Figure 2:
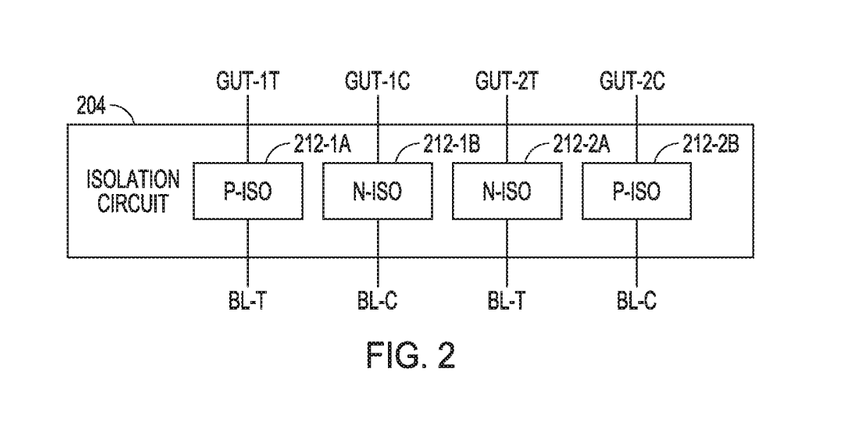
FIG. 2 illustrates an embodiment of an isolation circuit of the system of FIG. 1.

FIG. 2 illustrates an embodiment of an isolation circuit 204, which represents an example of isolation circuit 104. Isolation circuit 204 can include a first P-channel isolation (P-ISO) device 212-1A coupled between BL-T and GUT-1T (true input of SA 108-1), a first N-channel isolation (N-ISO) device 212-1B coupled between BL-C and GUT-1C (complementary input of SA 108-1), a second N-channel isolation (N-ISO) device 212-2A coupled between BL-T and GUT-2T (true input of SA 108-2), and a second P-channel isolation (P-ISO) device 212-2B coupled between BL-C and GUT-2C (complementary input of SA 108-2). These ISO devices isolate the digit line gut nodes of the sense amplifiers from the digit lines (bit lines). In various embodiments, N-ISO devices 212-1B and 212-2A can each include an N-channel metal-oxide semiconductor field-effect transistor (MOSFET) with an elevated gate voltage. P-ISO devices 212-1A and 212-2B can each include a P-channel MOSFET with an elevated gate voltage. The elevated gate voltages bias SA 108-1 and SA 108-2 to read complementary logic levels during preconditioning before sensing the data state from memory cell 102.

Figure 3:
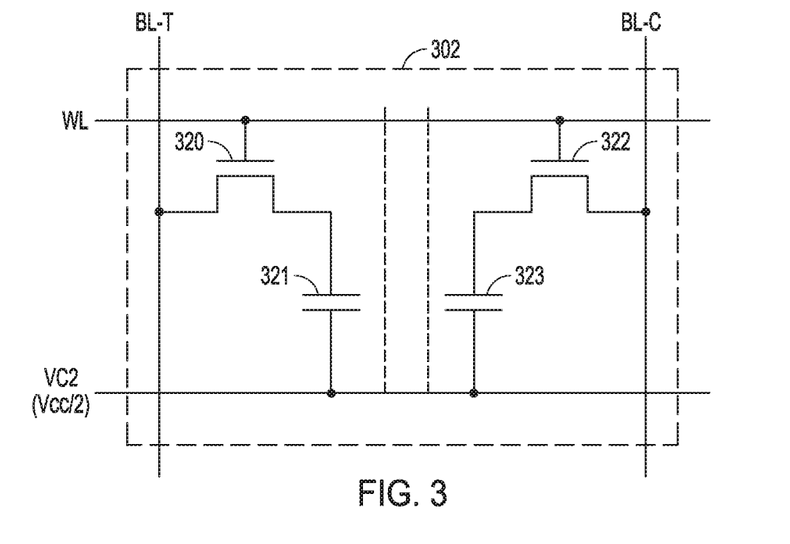
FIG. 3 illustrates an embodiment of the DRAM cell of FIG. 1.
Figure 4:
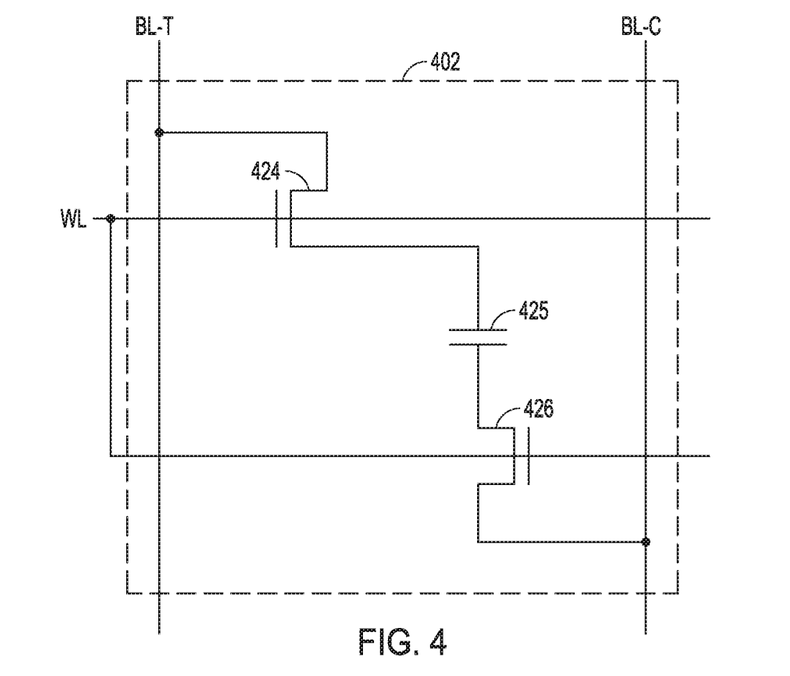
FIG. 4 illustrates another embodiment of the DRAM cell of FIG. 1.

FIGS. 3 and 4 illustrates examples of memory cell 102. A DRAM cell can be composed of one transistor and one capacitor (referred to as "1T-1C", not shown in the figures). One side of the capacitor connects to the transistor, while the other side of the capacitor connects to a reference voltage (e.g., VC2, or Vcc/2, one half of the supply voltage of the DRAM device). The capacitor stores one data state ("1" or "0") for one memory cell unit. The capacitor discharges to a bit line. A sense amplifier amplifies the differential signal between the bit line and the reference voltage to sense the data state. System 100 can be implemented with a DRAM cell that is composed of two transistors and two capacitors (referred to as "2T-2C") or a DRAM cell that is composed of two transistors and one capacitor (referred to as "2T-1C"), as discussed with references to FIGS. 3 and 4.

FIG. 3 illustrates an embodiment of a memory cell 302, which represents an example of memory cell 102. Memory cell 302 is a 2T-2C DRAM cell including transistors 320 and 322 with gates connected to a word line (WL) for enabling data state sensing and capacitors 321 and 323. One side of each of capacitors 321 and 323 connects to transistors 320 and 322, respectively, while the other side of each of capacitors 321 and 323 connects to a fixed voltage (e.g., VC2). Capacitors 321 and 323 store complementary data for one memory cell unit (e.g., capacitor 321 stores true data, and capacitor 323 stores complementary data). Capacitor 321 discharges to BL-T, and capacitor 323 discharges to BL-C. Sensing circuit 106 amplifies the differential signal between BL-T and BL-C to sense the data state stored in memory cell 302. No other reference voltage is required for the sensing. This 2T-2C memory cell can provide a differential signal that has an amplitude twice as large as the differential signal produced by the 1T-1C memory cell.

FIG. 4 illustrates another embodiment of a memory cell 402, which represents another example of memory cell 102. Memory cell 402 is a 2T-1C DRAM cell including transistors 424 and 426 with gates connected to a word line (WL) for enabling data state sensing and a capacitor 425. Each plate of capacitor 425 connects to one of transistors 424 and 426 (with no plate connected to a fixed voltage). Capacitor 425 discharges to BL-T and BL-C. Sensing circuit 106 amplifies the differential signal the differential signal between BL-T and BL-C to sense the data state stored in memory cell 402. No other reference voltage is required for the sensing. This 2T-1C memory cell can provide a differential signal that has an amplitude three times as large as the differential signal produced by the 1T-1C memory cell.

Figure 5:
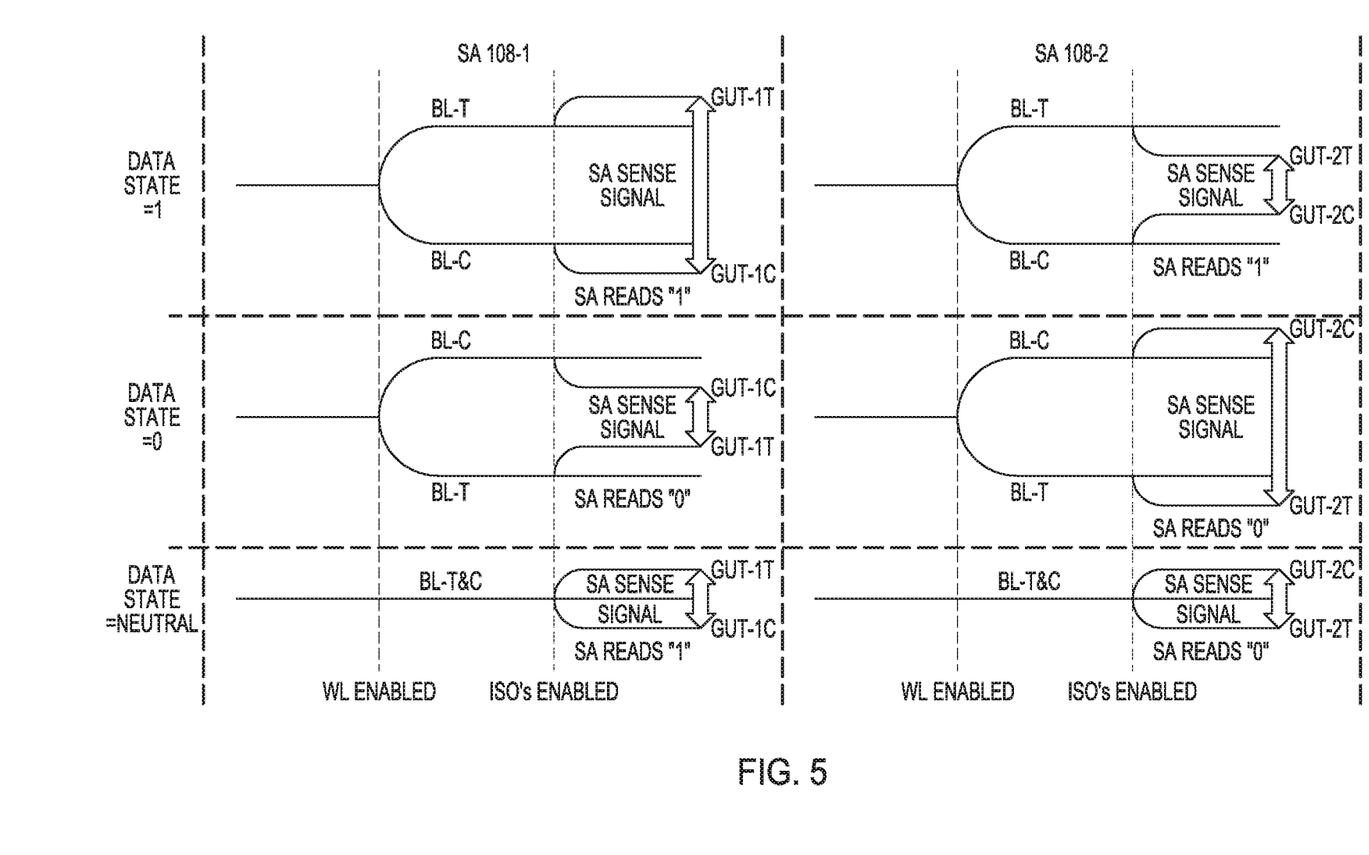
FIG. 5 illustrates an embodiment of gut node biasing of the sense amplifiers of FIG. 1.

FIG. 5 illustrates an embodiment of gut node biasing of SA 108-1 and SA 108-2. The voltage levels at BL-T, BL-C, GUT-1T, GUT-1C, GUT-2T, and GUT-2C are shown for each data state read by SA 108-1 and SA 108-2. When word line (WL) is enabled, SA 108-1 and SA 108-2 are preconditioned by biasing their gut nodes with voltage levels at BL-T and BL-C. When the ISO devices 212 are enabled, SA 108-1 and SA 108-2 read the data state.

Figure 6:
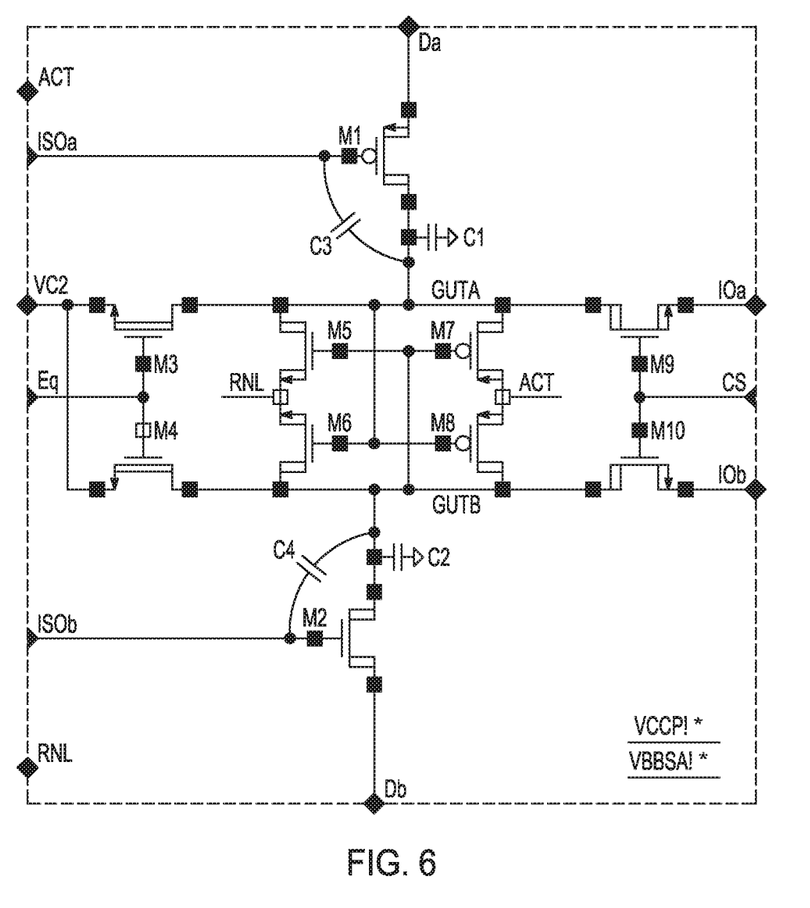
FIG. 6 illustrates an embodiment of a sense amplifier circuit for use in the system of FIG. 1.

FIG. 6 illustrates an embodiment of a sense amplifier circuit for use in system 100. The circuit as shown in FIG. 6 can be used as, for example, SA 108-1 with P-ISO 212-1A and N-ISO 212-1B. With M1 changed to an N-channel MOSFET and M2 changed to a P-channel MOSFET (i.e., device types for M1 and M2 swapped), the circuit can be used as, for example, SA 108-2 with N-ISO 212-2A and P-ISO 212-2B.

Elements and nodes of the circuit are as follows:
RNL: The voltage applied to the N-sense amplifier (M5-M6) to enable/disable them.
ACT: The voltage applied to the P-sense amplifier (M7-M8) to enable/disable them.
ISOa: The gate of the isolation device connected to array digit "a".
ISOb: The gate of the isolation device connected to array digit "b".
VC2: One half of the supply voltage, also referred to as Vcc/2, AVC2, or DVC2.
Eq: The signal that controls the devices in the sense amplifier that equilibrate the digits back to VC2.
Da: A digit line of the sense amplifier, to be considered to come from the adjacent memory array that is activated, so it is the digit that is being used for reading and writing.
Db: A digit line of the sense amplifier, to be considered to come from the adjacent memory array that is not activated, so it is the digit that is being used as a reference for sensing.
IOa: The input/output line for writing to and reading from the sense amplifier, connected to digit a.
IOb: The input/output line for writing to and reading from the sense amplifier, connected to digit b.
CS: The Column Select enable signal, which controls whether the inputs/outputs are connected to the digits or not.
GUTA, GUTB: SA gut nodes.
VCCP!: An elevated voltage applied to the gate of an N-channel device which allows it to pass the full Vcc level though it, the gate voltage of the access device transistors in the memory array.
VBBSA!: The bulk voltage for the N-channel devices located in the sense amplifier, usually around −0.3V, allowing for tuning the threshold voltage of the N-sense amplifiers.
M1, M2: MOSFETs used as isolation devices.
M3-M10: MOSFETs used as sense amplifiers.
C1, C2: SA gut node parasitic capacitors.
C3, C4: Showing built-in gate to source/drain capacitances used to couple the SA gut nodes.

Figure 7:
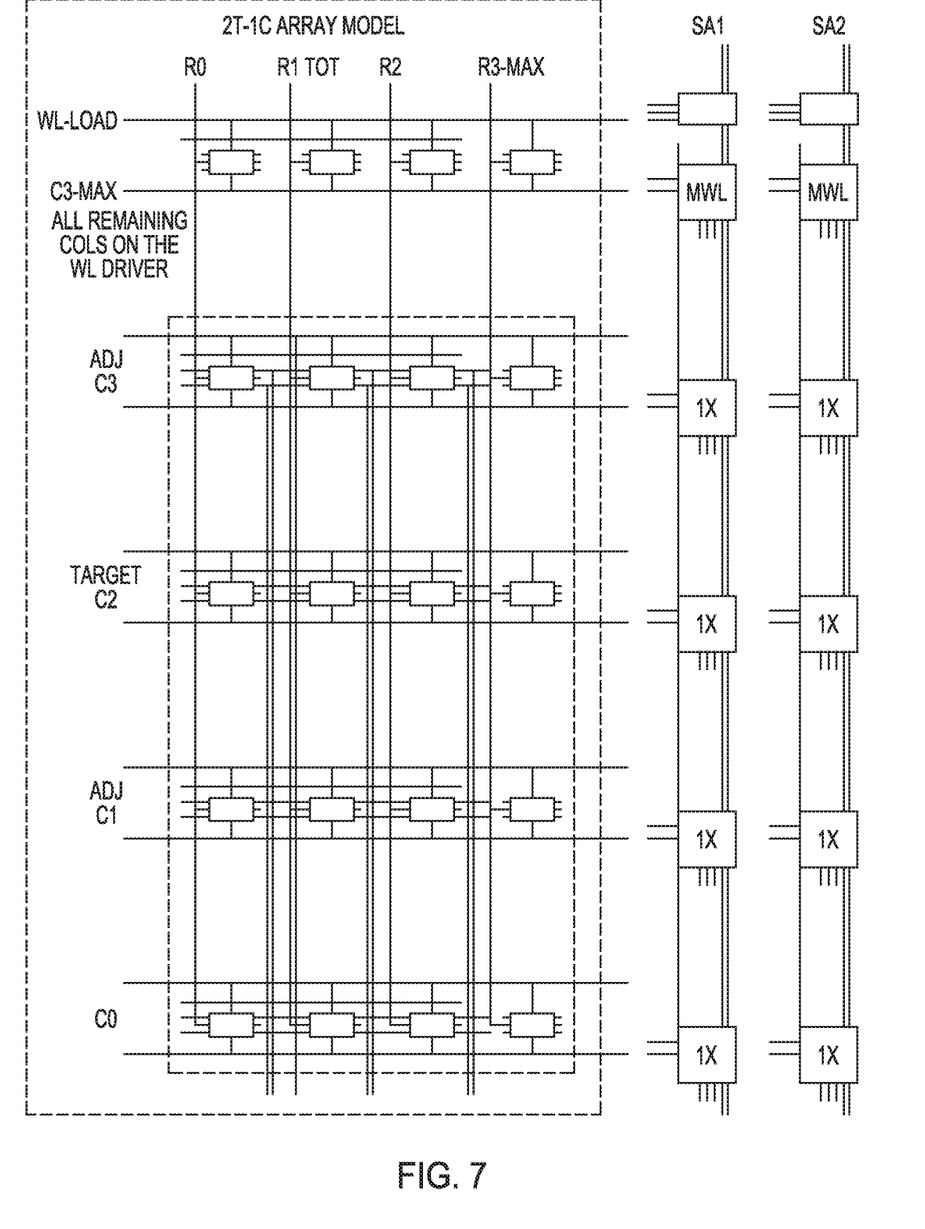
FIG. 7 illustrates an embodiment of portions of a DRAM device.

FIG. 7 illustrates an embodiment of portions of a DRAM device that include an array of 2T-1C cells. A pair of SA1 and SA2 is used to read the data state from each of the cells.

Figure 8:
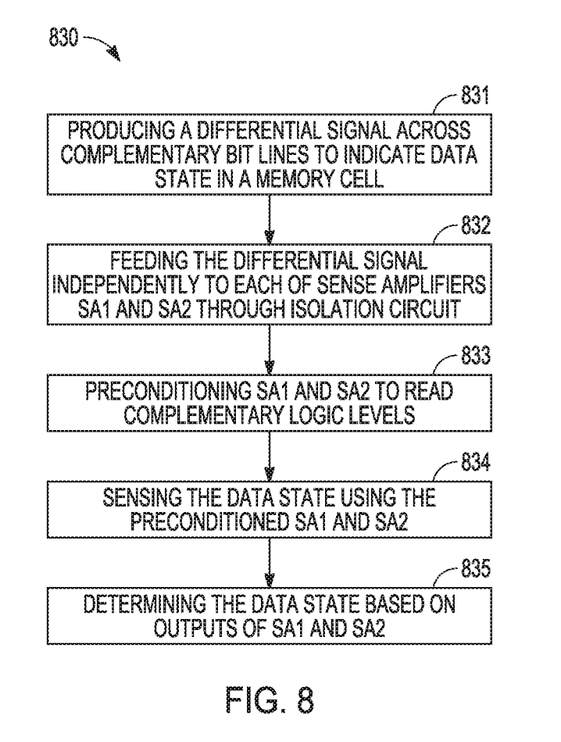
FIG. 8 illustrates an embodiment of a method for reading from a DRAM cell.

FIG. 8 illustrates an embodiment of a method 830 for reading from a memory cell such as a DRAM cell. In one embodiment, method 830 can be performed by system 100.

At 831, a differential signal is produced across a pair of complementary bit lines, such as a pair of a true bit line (BL-T) and a complementary bit line (BL-C). The differential signal indicates the data state. In one embodiment, the data state can be one of a high state ("1"), a low state ("0"), and a neutral state (e.g., indication of lacking of data, created by writing into the memory cell a voltage level being approximately one half of a supply voltage for the DRAM device. In one embodiment, the memory cell has a 2T-1C structure, and the differential signal is produced by discharging a capacitor of the memory cell to the pair of complementary bit lines. In another embodiment, the memory cell has a 2T-2C structure, and the differential signal is produced by discharging a first capacitor of the memory cell to a first bit line of the pair of complementary bit lines and discharging a second capacitor of the memory cell to a second bit line of the pair of complementary bit lines.

At 832, the differential signal is fed independently to each sense amplifier (SA) of a pair of first SA (SA1) and second SA (SA2) through an isolation circuit coupled between the pair of complementary bit lines and the pair of SA1 and SA2. In one embodiment, the differential signal is fed to the SA1 using (1) a first P-channel isolation (P-ISO) device coupled between the BL-T and a first input of the SA1 and (2) a first N-channel isolation (N-ISO) device coupled between the BL-C and a second input of the SA1. The differential signal is also fed to the SA2 using (1) a second P-channel isolation (P-ISO) device coupled between the BL-C and the second input of the SA2 and (2) a second N-channel isolation (N-ISO) device coupled between the BL-T and the first input of the SA2.

At 833, the pair of SA1 and SA2 are preconditioned such that SM and SA2 produce outputs indicating complementary logic levels. For example, SA1 and SA2 are biased such that SA1 reads "1" and SA2 reads "0".

At 834, the data state of the memory cell is sensed using the preconditioned SA1 and SA2. At 835, the data state is determined based on the outputs of SA1 and SA2. The data state is indicated to be equal to the data state as sensed by SA1 and the data state as sensed by SA2 when the data state as sensed by SA1 and the data state as sensed by SA2 are equal. The data state is indicated to be the neutral data state when the data state as sensed by SA1 and the data state as sensed by SA2 are not equal. In one embodiments, the outputs of SA1 and SA2 to an exclusive OR gate to determine whether the data state as sensed by SA1 and the data state as sensed by SA2 are equal. If SA1 reads "0" and SA2 reads "0", the data state is "0". If SA1 reads "0" and SA2 reads "1", the data state is neutral. If SA1 reads "1" and SA2 reads "0", the data state is neutral. If SA1 reads "1" and SA2 reads "1", the data state is '1".

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples one or more aspects thereof) shown or described herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A sensing system for reading from a memory cell configured to store a data bit and to produce a differential signal indicating a data state of the memory cell, the data state selected from three data states, the system comprising:
    a pair of bit lines coupled to the memory cell to receive the differential signal;
    a pair of sense amplifiers (SAs);
    an isolation circuit coupled between the pair of bit lines and the pair of SAs to independently couple each SA of the pair of SAs to the pair of bit lines; and
    a data output circuit configured to receive outputs from the pair of SAs and indicate the data state of the memory cell based on the outputs.

2. The system of claim 1, wherein the data output circuit is configured to indicate the data state as one of a high state indicating data "1", a low state indicating data "0", and a neutral state indicating lacking of data.

3. The system of claim 2, wherein the isolation circuit is configured to precondition one of the pair of SAs to read data "1" and the other of the pair of SAs to read data "0".

4. The system of claim 3, wherein the pair of bit lines comprises a true bit line (BL-T) and a complementary bit line (BL-C), and the pair of SAs comprises:
    a first sense amplifier (SA1) having an SA1 input A coupled to the BL-T, an SA1 input B coupled to the BL-C, and an SA1 output configured to indicate an SA1 data state; and
    a second sense amplifier (SA2) having an SA2 input A coupled to the BL-T, an SA2 input B coupled to the BL-C, and an SA2 output configured to indicate an SA2 data state.

5. The system of claim 4, wherein the SA1 and the SA2 are substantially identical.

6. The system of claim 4, wherein the isolation circuit comprises
    a first P-channel isolation (P-ISO) device coupled between the BL-T and the SA1 input A;
    a first N-channel isolation (N-ISO) device coupled between the BL-C and the SA1 input B;
    a second P-channel isolation (P-ISO) device coupled between the BL-C and the SA2 input B; and
    a second N-channel isolation (N-ISO) device coupled between the BL-T and the SA2 input A.

7. The system of claim 4, wherein the data output circuit is configured to indicate the data state to be equal to the SA1 data state and the SA2 data state when the SA1 data state and the SA2 data state are equal, and to indicate the data state to be the neutral data state when the SA1 data state and the SA2 data state are not equal.

8. The system of claim 7, further comprising an exclusive OR (XOR) gate having a first XOR input coupled to the SA1 output, a second XOR input coupled to the SA2 output, and an XOR output indicating whether the SA1 data state and the SA2 data state are equal.

9. A memory device, comprising:
    a pair of bit lines;
    a memory cell configured to store a data bit and produce a differential signal across the pair of bit lines, the differential signal indicating a data state of the memory cell, the data state selected from a high state, a low state, and a neutral state;
    a pair of sense amplifiers (SAs);
    an isolation circuit coupled between the pair of bit lines and the pair of SAs, the isolation circuit configured to feed the differential signal to each SA of the pair of SAs independently; and
    a data output circuit configured to receive outputs from the pair of SAs and indicate the data state of the memory cell based on the outputs.

10. The device of claim 9, wherein the memory cell comprises two transistors and two capacitors.

11. The device of claim 9, wherein the memory cell comprises two transistors and one capacitor.

12. The device of claim 9, wherein the isolation circuit is configured to precondition an SA of the pair of SAs to read data "1" and the other SA of the pair of SAs to read data "0".

13. The device of claim 12, wherein the pair of SAs comprises a first output indicating the data state as sensed by one SA of the pair of SAs and a second output indicating the data state as sensed by the other SA of the pair of SAs, and data output circuit is configured to indicate the data state to be the data state indicated by both the first output and the second output when the first output and the second output indicate the same data state, and to indicate the data state to be the neutral state when the first output and the second output indicate different data states.

14. A method for sensing a data state from a memory cell of a memory device, the method comprising:
    producing a differential signal across a pair of bit lines, the differential signal indicating the data state as one of a high state, a low state, and a neutral state;
    feeding the differential signal independently to each sense amplifier (SA) of a pair of first SA (SA1) and second SA (SA2) through an isolation circuit coupled between the pair of bit lines and the pair of SA1 and SA2;
    preconditioning the pair of SA1 and SA2 such that SA1 and SA2 produce outputs indicating complementary logic levels;
    sensing the data state using the preconditioned pair of SA1 and SA2; and
    determining the data state based on the outputs of SA1 and SA2.

15. The method of claim 14, wherein producing the differential signal comprises discharging a capacitor of the memory cell to the pair of bit lines.

16. The method of claim 14, wherein producing the differential signal comprises discharging a first capacitor of the memory cell to a first bit line of the pair of bit lines and discharging a second capacitor of the memory cell to a second hit line of the pair of hit lines.

17. The method of claim 14, wherein producing the differential signal across a pair of bit lines comprises producing the differential signal across a pair of a true bit line (BL-T) and a complementary bit line (BL-C), and feeding the different signal independently to each SA of the pair of SA1 and SA2 using the isolation circuit comprises:
    feeding the differential signal to SA1 using a first P-channel isolation (P-ISO) device coupled between the BL-T and a first input of SA1 and a first N-channel isolation (N-ISO) device coupled between the BL-C and a second input of SA1; and
    feeding the differential signal to SA2 using a second P-channel isolation (P-ISO) device coupled between the BL-C and the second input of SA2 and a second N-channel isolation (N-ISO) device coupled between the BL-T and the first input of SA2.

18. The method of claim 17, wherein determining the data state comprises:
    indicating a data state equal to the data state as sensed by SA1 and the data state as sensed by SA2 when the data state as sensed by SA1 and the data state as sensed by SA2 are equal; and
    indicating the neutral data state when the data state as sensed by SA1 and the data state as sensed by SA2 are not equal.

19. The method of claim 18, wherein determining the data state comprises feeding the outputs of SA1 and SA2 to an exclusive OR gate to determine whether the data state as sensed by SA1 and the data state as sensed by SA2 are equal.

20. The method of claim 19, comprising creating the neutral state by writing into the memory cell a voltage level being approximately one half of a supply voltage for the DRAM device.

* * * * *